(12) United States Patent
Hu et al.

(10) Patent No.: US 11,974,479 B2
(45) Date of Patent: Apr. 30, 2024

(54) ELECTRICAL CONNECTION STRUCTURE AND ELECTRONIC DEVICE COMPRISING THE SAME

(71) Applicant: InnoLux Corporation, Miao-Li County (TW)

(72) Inventors: Shun-Yuan Hu, Miao-Li County (TW); Chin-Lung Ting, Miao-Li County (TW); Li-Wei Mao, Miao-Li County (TW); Ming-Chun Tseng, Miao-Li County (TW); Kung-Chen Kuo, Miao-Li County (TW); Yi-Hua Hsu, Miao-Li County (TW); Ker-Yih Kao, Miao-Li County (TW)

(73) Assignee: INNOLUX CORPORATION, Miao-Li County (TW)

( * ) Notice: Subject to any disclaimer, the term of this patent is extended or adjusted under 35 U.S.C. 154(b) by 124 days.

(21) Appl. No.: 17/119,864

(22) Filed: Dec. 11, 2020

(65) Prior Publication Data

US 2021/0193689 A1 Jun. 24, 2021

Related U.S. Application Data

(60) Provisional application No. 62/951,159, filed on Dec. 20, 2019.

(30) Foreign Application Priority Data

Sep. 18, 2020 (CN) .......................... 202010987044.3

(51) Int. Cl.
*H01L 23/498* (2006.01)
*G09F 9/302* (2006.01)
(Continued)

(52) U.S. Cl.
CPC .......... *H10K 59/18* (2023.02); *G09F 9/3026* (2013.01); *G09G 3/006* (2013.01); *H01L 24/24* (2013.01);
(Continued)

(58) Field of Classification Search
CPC ............... H01L 25/167; H01L 25/0753; H01L 23/49811; H01L 23/49827; H01L 23/49838
See application file for complete search history.

(56) References Cited

U.S. PATENT DOCUMENTS

2004/0041741 A1* 3/2004 Hayes ................ H01Q 15/0033
343/909
2004/0106335 A1* 6/2004 Nemoto .............. H01L 23/3107
257/E21.511
(Continued)

FOREIGN PATENT DOCUMENTS

CN 1822360 A 8/2006
CN 105261571 A * 1/2016
CN 205828430 U * 12/2016

OTHER PUBLICATIONS

Definition of "Circuit", https://www.thefreedictionary.com (2022) (Year: 2022).*
(Continued)

*Primary Examiner* — Michele Fan
(74) *Attorney, Agent, or Firm* — McClure, Qualey & Rodack, LLP

(57) ABSTRACT

An electrical connection structure is provided. The electrical connection structure includes a through hole, a first pad, a second pad and a conductive bridge. The through hole has a first end and a second end. The first pad at least partially surrounds the first end of the through hole and is electrically connected to a first circuit. The second pad is located at the second end of the through hole and is electrically connected
(Continued)

to a second circuit. The conductive bridge is connected to the first pad and second pad through the through hole, thereby making the first and second circuits electrically connected to each other.

15 Claims, 11 Drawing Sheets

(51) Int. Cl.
    *G09G 3/00*     (2006.01)
    *H01L 23/00*     (2006.01)
    *H01L 25/16*     (2023.01)
    *H01L 27/12*     (2006.01)
    *H10K 50/86*     (2023.01)
    *H10K 59/131*     (2023.01)
    *H10K 59/18*     (2023.01)
    *H10K 77/10*     (2023.01)
    *H01L 21/66*     (2006.01)

(52) U.S. Cl.
    CPC .............. *H01L 24/32* (2013.01); *H01L 24/73* (2013.01); *H01L 24/92* (2013.01); *H01L 25/162* (2013.01); *H01L 25/167* (2013.01); *H01L 27/124* (2013.01); *H10K 50/865* (2023.02); *H10K 59/131* (2023.02); *H10K 77/111* (2023.02); *H01L 22/14* (2013.01); *H01L 2224/24226* (2013.01); *H01L 2224/245* (2013.01); *H01L 2224/32225* (2013.01); *H01L 2224/73267* (2013.01); *H01L 2224/92244* (2013.01)

(56) References Cited

U.S. PATENT DOCUMENTS

| | | | |
|---|---|---|---|
| 2005/0224985 A1* | 10/2005 | Japp | H05K 1/0373 257/762 |
| 2007/0114564 A1* | 5/2007 | Lee | H01L 33/20 257/103 |
| 2017/0047393 A1* | 2/2017 | Bower | H01L 33/62 |
| 2018/0254226 A1 | 9/2018 | Iguchi | |
| 2018/0343739 A1 | 11/2018 | Lai | |
| 2020/0312883 A1* | 10/2020 | Qu | H01L 23/49805 |

OTHER PUBLICATIONS

Chinese language office action dated Jan. 24, 2024, issued in application No. CN 202010987044.3.

* cited by examiner

ELECTRICAL CONNECTION STRUCTURE AND ELECTRONIC DEVICE COMPRISING THE SAME

CROSS REFERENCE TO RELATED APPLICATIONS

This application claims the benefit of U.S. Provisional Application No. 62/951,159, filed on Dec. 20, 2019, and priority of China Patent Application No. 202010987044.3, filed on Sep. 18, 2020, the entirety of which are incorporated by reference herein.

BACKGROUND

Technical Field

The present disclosure relates to a light-emitting device, and in particular it relates to a light-emitting device including a circuit substrate with double-sided circuits.

Description of the Related Art

In a current light-emitting device, since the position of each light source in the light-emitting device is different, the length of each trace may be different, resulting in the impedance difference in overall circuits. Then the performance of the device will be affected.

SUMMARY

In accordance with one embodiment of the present disclosure, an electrical connection structure is provided. The electrical connection structure includes a through hole, a first pad, a second pad and a conductive bridge. The through hole has a first end and a second end. The first pad at least partially surrounds the first end of the through hole and is electrically connected to a first circuit. The second pad is located at the second end of the through hole and is electrically connected to a second circuit. The conductive bridge is connected to the first pad and second pad through the through hole, thereby making the first and second circuits electrically connected to each other.

A detailed description is given in the following embodiments with reference to the accompanying drawings.

BRIEF DESCRIPTION OF THE DRAWINGS

The disclosure may be more fully understood by reading the subsequent detailed description and examples with references made to the accompanying drawings, wherein.

DETAILED DESCRIPTION

Figure 1:
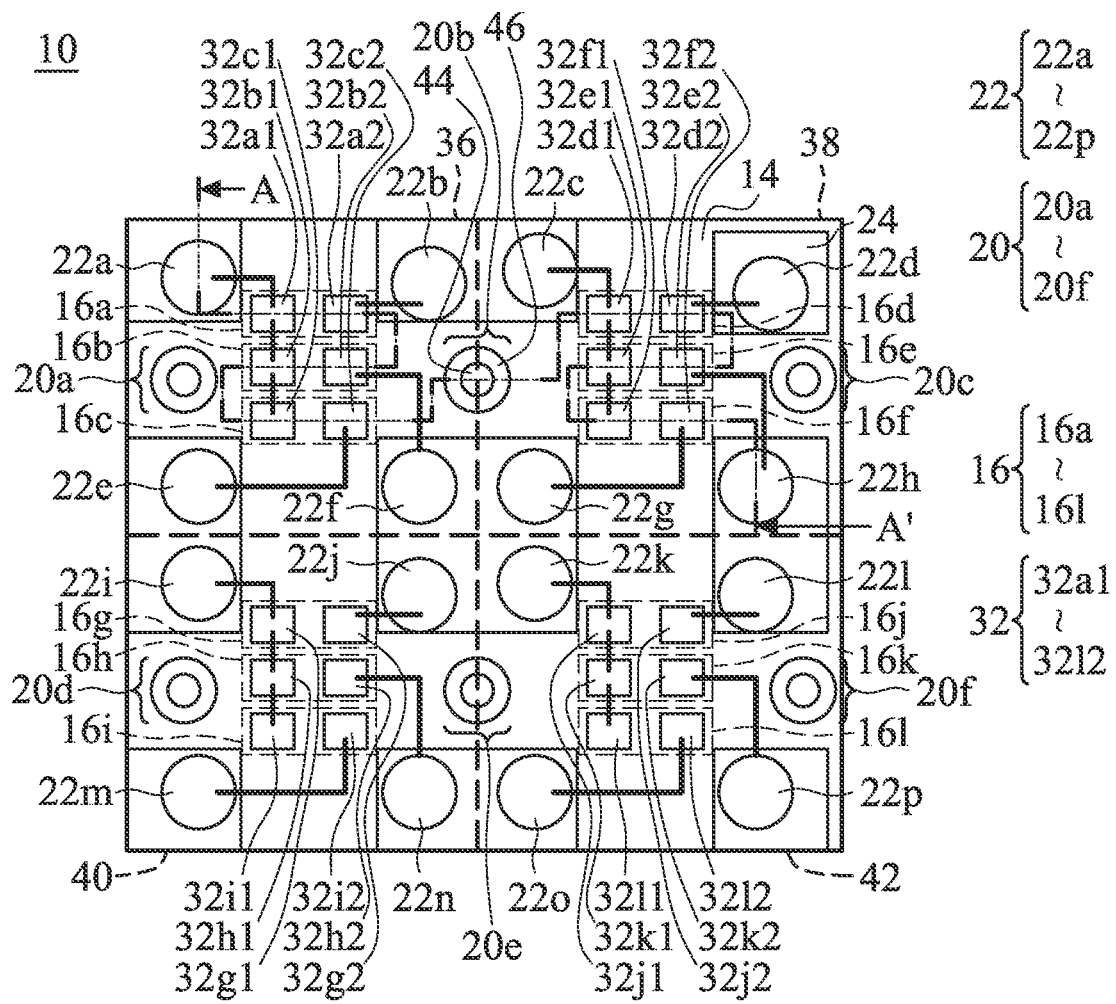
FIG. 1 is a schematic top-view of an electronic device in accordance with one embodiment of the present disclosure.

Various embodiments or examples are provided in the following description to implement different features of the present disclosure. The elements and arrangement described in the following specific examples are merely provided for introducing the present disclosure and serve as examples without limiting the scope of the present disclosure. For example, when a first component is referred to as "on a second component", it may directly contact the second component, or there may be other components in between, and the first component and the second component do not come in direct contact with one another.

It should be understood that additional operations may be provided before, during, and/or after the described method. In accordance with some embodiments, some of the stages (or steps) described below may be replaced or omitted.

In this specification, spatial terms may be used, such as "below", "lower", "above", "higher" and similar terms, for briefly describing the relationship between an element relative to another element in the figures. Besides the directions illustrated in the figures, the devices may be used or operated in different directions. When the device is turned to different directions (such as rotated 45 degrees or other directions), the spatially related adjectives used in it will also be interpreted according to the turned position.

Herein, the terms "about", "around" and "substantially" typically mean a value is in a range of +/−20% of a stated value, typically a range of +/−10% of the stated value, typically a range of +/−5% of the stated value, typically a range of +/−3% of the stated value, typically a range of +/−2% of the stated value, typically a range of +/−1% of the stated value, or typically a range of +/−0.5% of the stated value. The stated value of the present disclosure is an approximate value. Namely, the meaning of "about", "around" and "substantially" still exists even if there is no specific description of "about", "around" and "substantially".

It should be understood that, although the terms first, second, third etc. may be used herein to describe various elements, components, regions, layers, portions and/or sections, these elements, components, regions, layers, portions and/or sections should not be limited by these terms. These terms are only used to distinguish one element, component, region, layer, portion or section from another element, component, region, layer or section from another element, component, region, layer or section from another element, component, region, layer or section. Thus, a first element, component, region, layer, portion or section discussed below could be termed a second element, component, region, layer, portion or section without departing from the teachings of the present disclosure.

Unless defined otherwise, all technical and scientific terms used herein have the same meaning as commonly understood by one of ordinary skill in the art to which this disclosure belongs. It should be appreciated that, in each case, the term, which is defined in a commonly used dictionary, should be interpreted as having a meaning that conforms to the relative skills of the present disclosure and the background or the context of the present disclosure, and should not be interpreted in an idealized or overly formal manner unless so defined.

Figure 2:
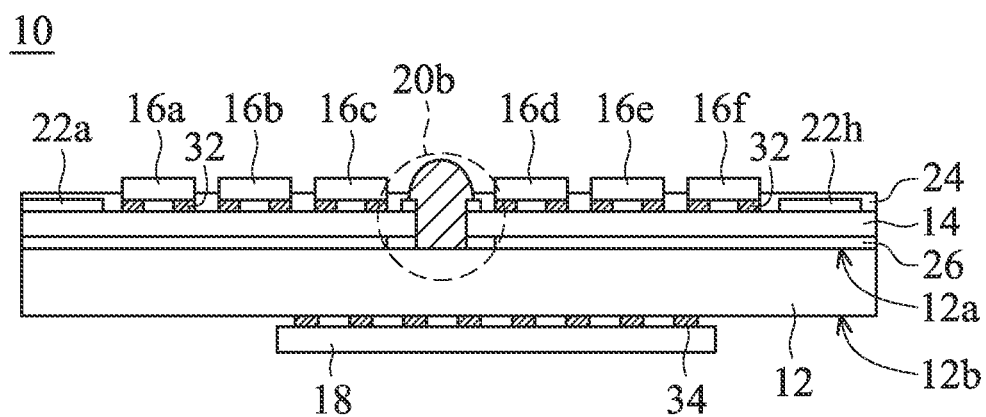
FIG. 2 is a schematic cross-sectional view of an electronic device in accordance with one embodiment of the present disclosure.

Referring to FIGS. 1 and 2, in accordance with one embodiment of the present disclosure, an electronic device 10 is provided. FIG. 1 is a schematic top-view of the electronic device 10. FIG. 2 is a schematic cross-sectional view taken along section line A-A' in FIG. 1.

Figure 3:
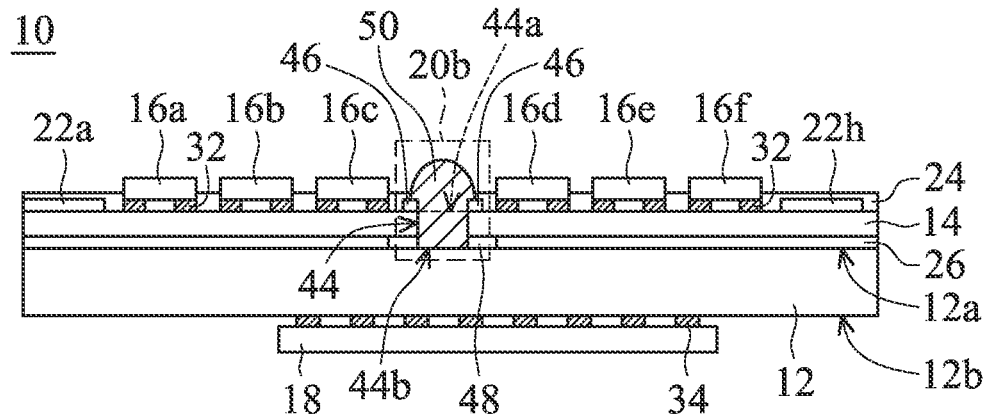
FIG. 3 is a schematic cross-sectional view of an electronic device in accordance with one embodiment of the present disclosure.

In the embodiment shown in FIGS. 1 and 2, the electronic device 10 includes a circuit substrate 12, an array substrate 14, a plurality of light-emitting units 16 (16a, 16b, 16c, 16d, 16e, 16f, 16g, 16h, 16i, 16j, 16k and 16l), a driver 18, a plurality of electrical connection structures 20 (20a, 20b, 20c, 20d, 20e and 20f), a plurality of test pads 22 (22a, 22b, 22c, 22d, 22e, 22f, 22g, 22h, 22i, 22j, 22k, 22l, 22m, 22n, 22o and 22p), a light absorption layer 24 and an adhesive layer 26. The circuit substrate 12 has a top surface 12a and a bottom surface 12b. A top circuit (not shown) is disposed on the top surface 12a. A bottom circuit (not shown) is disposed on the bottom surface 12b and electrically connected to the top circuit. A thin film transistor array (not shown) is disposed on the array substrate 14. The array substrate 14 is disposed on the top surface 12a of the circuit substrate 12 and electrically connected to the top circuit. The light-emitting units 16 are disposed on the array substrate 14 through a plurality of contact pads 32 respectively. The driver 18 is disposed on the bottom surface 12b of the circuit substrate 12 through a plurality of contact pads 34 and electrically connected to the bottom circuit. The electrical connection structures 20 are disposed on the array substrate 14 and respectively penetrate the array substrate 14 and the adhesive layer 26 to electrically connect to the circuit substrate 12 and the driver 18 underneath the circuit substrate 12. The electrical connection structures 20 are respectively located near at least one of the light-emitting units 16. The structural composition of the electrical connection structure 20 will be detailed later (FIG. 3). The test pads 22 are disposed on the array substrate 14 and respectively located near at least one of the light-emitting units 16. The light absorption layer 24 covers at least one of the test pads 22, but the present disclosure is not limited thereto. The adhesive layer 26 is disposed between the circuit substrate 12 and the array substrate 14.

The electronic device 10 shown in FIGS. 1 and 2 is a light-emitting device, for example, a light-emitting diode (LED), but the present disclosure is not limited thereto. The light-emitting diode may include, for example, an organic light-emitting diode (OLED), an inorganic light-emitting diode such as a sub-millimeter light-emitting diode (mini LED), a micro light-emitting diode (micro LED) or a quantum dot light-emitting diode (QLED/QDLED), etc., but the present disclosure is not limited thereto. In some embodiments, the circuit substrate 12 may include, but is not limited to, a printed circuit board (PCB), for example, a printed circuit board with double-sided circuits. In some embodiments, the array substrate 14 may include a flexible substrate, for example, made of polyimide (PI) material, and its thickness may be less than or equal to 50 μm (0 μm<thickness≤50 μm), which is beneficial for manufacturing the electrical connection structures of the present disclosure, but in the present disclosure, the material and thickness of the array substrate 14 are not limited thereto. In some embodiments, the material of the array substrate 14 may also include glass, sapphire, or other suitable polymer materials, or materials such as ceramics or graphite with higher heat dissipation effects. In some embodiments, the light-emitting units 16 may include the aforementioned light-emitting diodes, but the present disclosure is not limited thereto. In some embodiments, the test pads 22 can be used to test the performance of the device during the manufacturing process. After testing, they are covered with the light absorption layer 24. In some embodiments, the width of the test pad 22 is approximately between 100 μm and 500 μm (100 μm≤width≤500 μm). In some embodiments, the material of the light absorption layer 24 includes any suitable material that can absorb light with a specific wavelength (such as visible light). In some embodiments, the adhesive layer 26 may include any suitable adhesive material, and the array substrate 14 is attached to the circuit substrate 12 by the adhesive layer 26.

Referring to FIG. 1, a part of the electrical connection design of the electronic device 10 is illustrated. In FIG. 1, the electrical connection structure 20 electrically connects to a first electronic component and a second electronic component. For example, the electrical connection structures 20 respectively connect the components located in specific areas, and the components in the areas are electrically connected to the underlying circuit substrate 12. For example, the light-emitting units (16a, 16b and 16c) are electrically connected to the circuit substrate 12 through the electrical connection structure 20b. The light-emitting units (16d, 16e and 16f) are electrically connected to the circuit substrate 12 through the electrical connection structure 20c. The light-emitting units (16g, 16h and 16i) are electrically connected to the circuit substrate 12 through the electrical connection structure 20e. The light-emitting units (16j, 16k and 16l) are electrically connected to the circuit substrate 12 through the electrical connection structure 20f. Therefore, a short electrical connection distance is formed between respective light-emitting unit and the printed circuit board, and the IR-drop can be effectively reduced. However, in the present disclosure, the corresponding relationship between the electrical connection structures and the light-emitting units is not limited thereto. In addition, in the embodiment shown in FIGS. 1 and 2, the electrical connection manner between the test pads 22 and the contact pads 32 adopts a common cathode design (i.e., a common cathode connection is formed between the test pads and the contact pads). For example, in the first area 36 of the array substrate 14, the test pad 22a is electrically connected to the contact pads (32a1, 32b1, 32c1) which work as cathodes. The test pad 22b is electrically connected to the contact pad 32a2 which works as an anode. The test pad 22f is electrically connected to the contact pad 32b2 which works as an anode. The test pad 22e is electrically connected to the contact pad 32c2 which works as an anode. In the second area 38 of the array substrate 14, the test pad 22c is electrically connected to the contact pads (32*d*1, 32*e*1 and 32*f*1) which work as cathodes. The test pad 22*d* is electrically connected to the contact pad 32*d*2 which works as an anode. The test pad 22*h* is electrically connected to the contact pad 32*e*2 which works as an anode. The test pad 22*g* is electrically connected to the contact pad 32*f*2 which works as an anode. In the third area 40 of the array substrate 14, the test pad 22*i* is simultaneously electrically connected to the contact pads (32*g*1, 32*h*1 and 32*i*1) which work as cathodes. The test pad 22*j* is electrically connected to the contact pad 32*g*2 which works as an anode. The test pad 22*n* is electrically connected to the contact pad 32*h*2 which works as an anode. The test pad 22*m* is electrically connected to the contact pad 32*i*2 which works as an anode. In the fourth area 42 of the array substrate 14, the test pad 22*k* is electrically connected to the contact pads (32*j*1, 32*k*1 and 32*l*1) which work as cathodes. The test pad 22*l* is electrically connected to the contact pad 32*j*2 which works as an anode. The test pad 22*p* is electrically connected to the contact pad 32*k*2 which works as an anode. The test pad 22*o* is electrically connected to the contact pad 32*l*2 which works as an anode. In some embodiments, the electrical connection manner between the test pads 22 and the contact pads 32 can also adopt a common anode design (i.e., a common anode connection is formed between the test pads and the contact pads), which is similar to the common cathode design, except that the cathode and anode of the pads are interchanged. However, the electrical connection manner between the test pads and the contact pads in the present disclosure is not limited to the above manner.

Referring to FIGS. 1 and 3, in accordance with one embodiment of the present disclosure, further details of the structural composition of the electrical connection structure 20 are provided herein. FIG. 3 is a schematic cross-sectional view of the electronic device 10, which will focus on the electrical connection structure. Since the structures of the plurality of electrical connection structures 20 may be similar, only the electrical connection structure 20*b* is used as an example for illustration. As shown in FIG. 3, the electrical connection structure 20*b* includes a first pad 46, a second pad 48 and a conductive bridge 50. The conductive bridge 50 is at least partially disposed in the through hole 44 and covers a part of the first pad 46. The through hole 44 has a first end 44*a* and a second end 44*b*. The first end 44*a* may be approximately the same height as the top surface of the array substrate 14, and the second end 44*b* may contact the top surface 12*a* of the circuit substrate 12, but it is not limited thereto. As shown in FIG. 1, the first pad 46 surrounds the through hole 44 and is electrically connected to the circuit (not shown) of the array substrate 14. The second pad 48 is located at the second end 44*b* of the through hole 44 and is electrically connected to the top circuit of the circuit board 12. The conductive bridge 50 electrically connects the first pad 46 and the second pad 48 through the through hole 44, and the circuit of the array substrate 14 and the top circuit of the circuit substrate 12 are electrically connected to each other. In the embodiment shown in FIGS. 1 and 3, the first pad 46 completely surrounds the through hole 44 and presents the form of a closed ring (as shown in FIG. 1), but in the present disclosure, the shape of the first pad 46 is not limited thereto. For example, in some embodiments, the first pad 46 can also only partially surround the through hole 44 and presents an unclosed structure. In some embodiments, the material of the first pad 46 and the second pad 48 may include a suitable conductive metal material, such as copper, nickel or gold, but it is not limited thereto. As shown in FIG. 3, the electrical connection structure 20*b* electrically connects the array substrate 14 and the circuit substrate 12, that is, signals can be transmitted between the array substrate 14 and the circuit substrate 12 through the electrical connection structure 20*b*. The array substrate 14 carries the circuits. The through hole 44 is at least partially formed in the array substrate 14 (i.e., the through hole 44 may penetrate the adhesive layer 26, and a portion of the through hole 44 is formed in the adhesive layer 26), and the first pad 46 is formed on the array substrate 14. The circuit substrate 12 carries the top circuit, and the second pad 48 is formed on the circuit substrate 12. In some embodiments, the material of the conductive bridge 50 may include a suitable conductive material, for example, gold, copper, silver paste or solder paste. In some embodiments, the manufacturing method of the electrical connection structure includes the following steps. First, the outer-ring metal is used as a mask. The material of the array substrate 14 in the inner ring is removed by methods such as laser, etching or drilling to form the through holes 44. The conductive material is then filled into the through hole 44 to electrically connect the circuit substrate 12.

Figure 4:
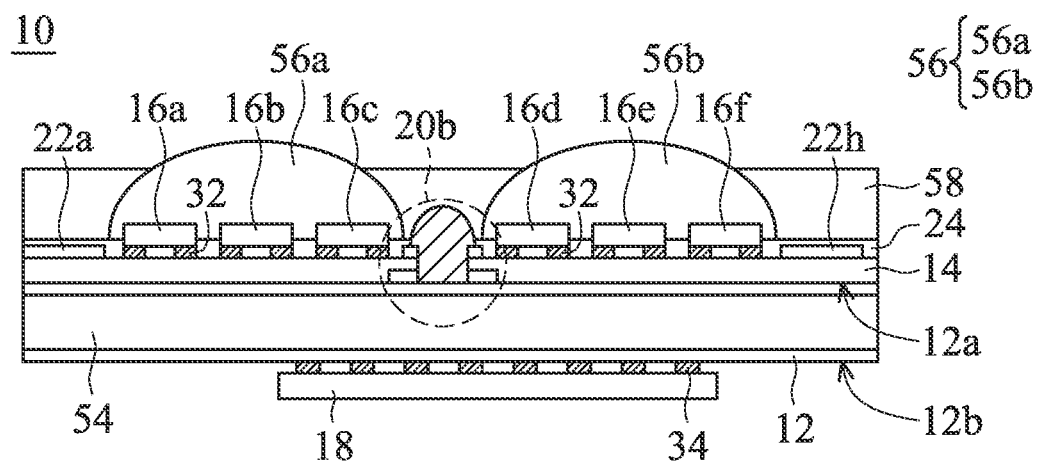
FIG. 4 is a schematic cross-sectional view of an electronic device in accordance with one embodiment of the present disclosure.

Referring to FIGS. 1 and 4, in accordance with one embodiment of the present disclosure, an electronic device 10 is provided. FIG. 1 is a schematic top-view of the electronic device 10. FIG. 4 is a schematic cross-sectional view of the electronic device 10 with additional components thereon, taken along section line A-A' in FIG. 1.

In the embodiment shown in FIGS. 1 and 4, some components are similar to those in the previous embodiments and will not be described again. The difference between the embodiment shown in FIG. 4 and the embodiment shown in FIG. 2 will be explained in the following paragraphs.

As shown in FIG. 4, the circuit substrate 12 may be disposed on the support substrate 54. More specifically, the circuit substrate 12 may completely or at least partially cover the support substrate 54. The circuit substrate 12 has a top surface 12*a* and a bottom surface 12*b*. The top surface 12*a* is located above the support substrate 54 and closest to the array substrate 14. The bottom surface 12*b* is located under the support substrate 54 and farthest from the array substrate 14. A top circuit is disposed on the top surface 12*a*, a bottom circuit is disposed on the bottom surface 12*b*, and the bottom circuit is electrically connected to the top circuit. The light extraction layers (56*a* and 56*b*) are disposed on the light-emitting units. For example, the light extraction layer 56*a* is disposed on the light-emitting units (16*a*, 16*b* and 16*c*). The light extraction layer 56*b* is disposed on the light-emitting units (16*d*, 16*e* and 16*f*), That is, one of the light extraction layers covers multiple of the light-emitting units. In some embodiments, one of the light extraction layers can also cover one of the light-emitting units. The shape of the light extraction layers 56 may be hemispherical, but it is not limited thereto. The light extraction layers 56 covering the light-emitting units can protect the underlying light-emitting units and increase the effect of light extraction (for example, changing the light intensity distribution of the light at different viewing angles after the light is emitted from the light-emitting unit). The protective layer 58 covers the light absorption layer 24, at least part of the light extraction layers 56, and at least one electrical connection structure 20*b* among the electrical connection structures 20.

The electronic device 10 shown in FIGS. 1 and 4 is a light-emitting device, for example, a light-emitting diode (LED), but the present disclosure is not limited thereto. The light-emitting diode may include, for example, an organic light-emitting diode (OLED), an inorganic light-emitting diode, a sub-millimeter light-emitting diode (mini LED), a micro light-emitting diode (micro LED) or a quantum dot light-emitting diode (QLED/QDLED), etc., but the present disclosure is not limited thereto. In some embodiments, the circuit substrate 12 may include, but is not limited to, a printed circuit board (PCB), for example, a printed circuit board with double-sided circuits. Since the circuit substrate 12 can at least partially cover the support substrate 54, it means that the circuit substrate 12 is a flexible printed circuit board (FPC). In some embodiments, the material of the support substrate 54 may include ceramics, aluminum or iron, but it is not limited thereto. In some embodiments, the material of the light extraction layers 56 may respectively include any suitable transparent polymer material. In some embodiments, the material of the protective layer 58 may include any suitable insulating material for planarization, protecting or isolating the underlying components, or for light absorption or light reflection.

According to product requirements, when a metal plate with high thermal conductivity or high strength is to be matched under the array substrate 14, the combination of the support substrate 54 (the material can be ceramic, aluminum or iron, etc.) as shown in FIG. 4 and the circuit substrate 12 can be selected.

Figure 5:
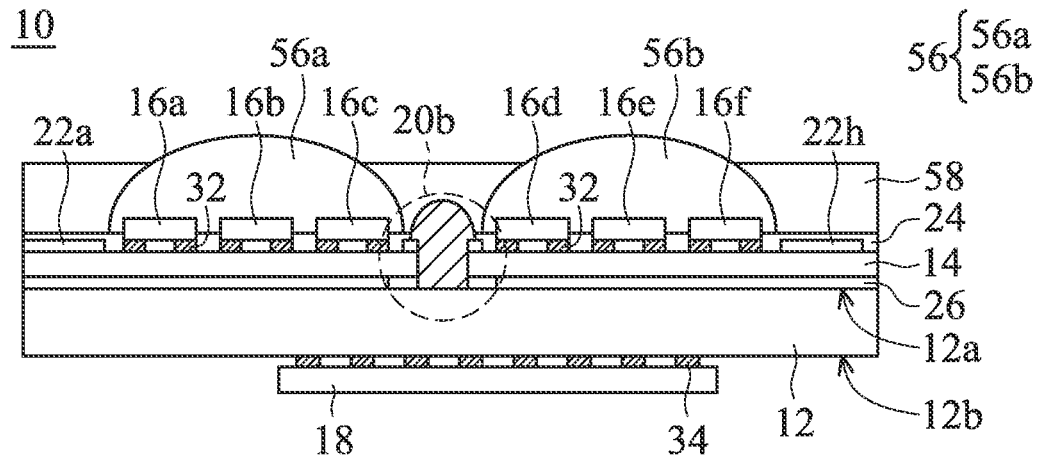
FIG. 5 is a schematic cross-sectional view of an electronic device in accordance with one embodiment of the present disclosure.

Referring to FIGS. 1 and 5, in accordance with one embodiment of the present disclosure, an electronic device 10 is provided. FIG. 1 is a schematic top-view of the electronic device 10. FIG. 5 is a schematic cross-sectional view of the electronic device 10 with additional components thereon, taken along section line A-A' in FIG. 1.

In the embodiment shown in FIGS. 1 and 5, the electronic device 10 includes a circuit substrate 12, an array substrate 14, a plurality of light-emitting units 16, a driver 18, a plurality of electrical connection structures 20, a plurality of test pads 22, a light absorption layer 24, an adhesive layer 26, a plurality of light extraction layers 56 and a protective layer 58. The similarities between the embodiment shown in FIG. 5 and the previous embodiments will not be repeated. The main difference between the embodiment shown in FIG. 5 and the embodiment shown in FIG. 2 is the arrangement of the light extraction layers 56 and the protective layer 58. In the embodiment shown in FIG. 5, the positions, shapes, and materials of the light extraction layers 56 and the protective layer 58 are similar to those in the embodiment shown in FIG. 4, so that they will not be described again.

Figure 6:
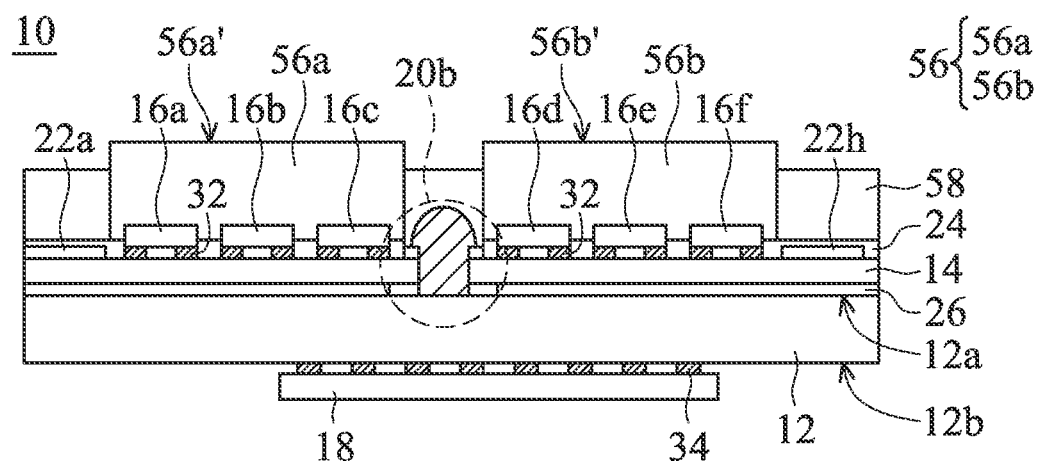
FIG. 6 is a schematic cross-sectional view of an electronic device in accordance with one embodiment of the present disclosure.

Referring to FIGS. 1 and 6, in accordance with one embodiment of the present disclosure, an electronic device 10 is provided. FIG. 1 is a schematic top-view of the electronic device 10. FIG. 6 is a schematic cross-sectional view of the electronic device 10 with additional components thereon, taken along section line A-A' in FIG. 1.

In the embodiment shown in FIGS. 1 and 6, the electronic device 10 includes a circuit substrate 12, an array substrate 14, a plurality of light-emitting units 16, a driver 18, a plurality of electrical connection structures 20, a plurality of test pads 22, a light absorption layer 24, an adhesive layer 26, a plurality of light extraction layers 56 and a protective layer 58. The similarities between the embodiment shown in FIG. 6 and the previous embodiments will not be repeated. The main difference between the embodiment shown in FIG. 6 and the embodiment shown in FIG. 5 is the shapes of the light extraction layers 56 and the protective layer 58. As shown in FIG. 6, the light extraction layers 56 may respectively have flattened top surfaces (56a' and 56b'). The protective layer 58 covers the light absorption layer 24 and at least one electrical connection structure 20b among the electrical connection structures 20, but does not cover the light extraction layers 56. However, it should be noted that the shapes of the light extraction layers 56 and the protective layer 58 in the present disclosure are not limited to the shapes shown in FIGS. 5 and 6.

Figure 7:
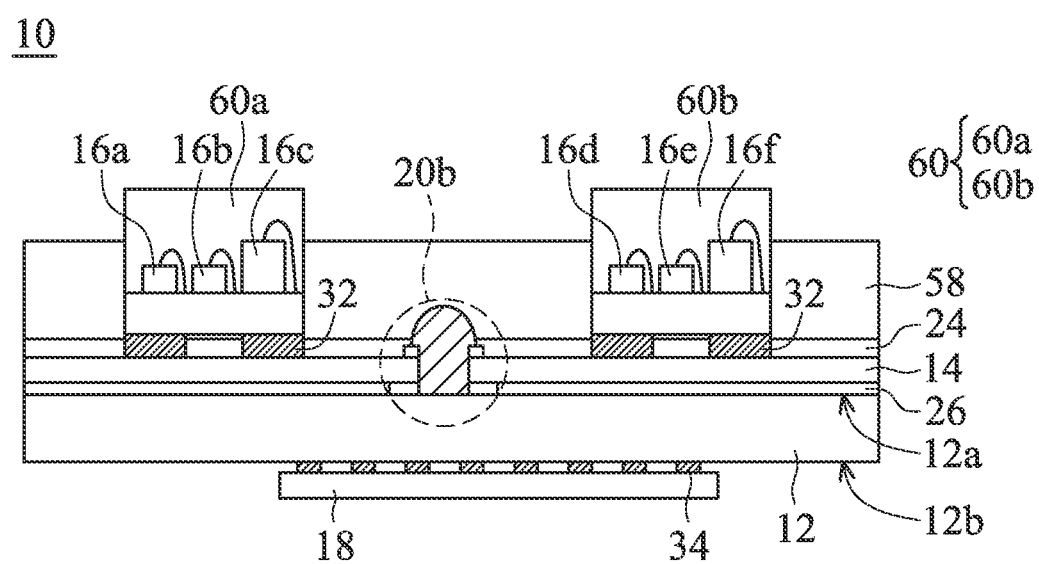
FIG. 7 is a schematic cross-sectional view of an electronic device in accordance with one embodiment of the present disclosure.

Referring to FIG. 7, in accordance with one embodiment of the present disclosure, an electronic device 10 is provided. FIG. 7 is a schematic cross-sectional view of the electronic device 10.

In the embodiment shown in FIG. 7, the electronic device 10 includes a circuit substrate 12, an array substrate 14, a plurality of package units (60a and 60b), a driver 18, a plurality of electrical connection structures 20, a light absorption layer 24 and an adhesive layer 26. The circuit substrate 12 has a top surface 12a and a bottom surface 12b. A top circuit is disposed on the top surface 12a. A bottom circuit is disposed on the bottom surface 12b and electrically connected to the top circuit. A thin film transistor array is disposed on the array substrate 14. The array substrate 14 is disposed on the top surface 12a of the circuit substrate 12 and electrically connected to the top circuit. One of the plurality of package units (60a and 60b) includes at least one light-emitting unit 16. For example, the light-emitting units (16a, 16b and 16c) constitute the package unit 60a. The light-emitting units (16d, 16e and 16f) constitute the package unit 60b, but the present disclosure is not limited thereto. The package units (60a and 60b) are disposed on the array substrate 14 through the contact pads 32. The driver 18 is disposed on the bottom surface 12b of the circuit substrate 12 through the contact pads 34 and electrically connected to the bottom circuit. The electrical connection structures 20 are disposed on the array substrate 14 and respectively penetrate the array substrate 14 and the adhesive layer 26 to electrically connect the circuit substrate 12 and the driver 18 underneath the circuit substrate 12. The electrical connection structures 20 is located around the package units (60a and 60b). The structural composition of the electrical connection structure 20b can be as shown in FIG. 3, and it will not be repeated here. The light absorption layer 24 covers the array substrate 14. The adhesive layer 26 is disposed between the circuit substrate 12 and the array substrate 14.

The electronic device 10 shown in FIG. 7 is a light-emitting device, for example, a light-emitting diode (LED), but the present disclosure is not limited thereto. The light-emitting diode may include, for example, an organic light-emitting diode (OLED), an inorganic light-emitting diode, a sub-millimeter light-emitting diode (mini LED), a micro light-emitting diode (micro LED) or a quantum dot light-emitting diode (QLED/QDLED), etc., but the present disclosure is not limited thereto. In some embodiments, the circuit substrate 12 may include a printed circuit board (PCB), for example, a printed circuit board with double-sided circuits, but the present disclosure is not limited thereto. In some embodiments, the array substrate 14 may include a flexible substrate, for example, made of polyimide (PI) material, and its thickness is less than about 30 μm, which is beneficial for manufacturing the electrical connection structures of the present disclosure. In some embodiments, the material of the array substrate 14 may also include glass, sapphire, or other suitable polymer materials, or materials such as ceramics or graphite with improved heat dissipation effects. In some embodiments, the light-emitting units (16a, 16b, 16c, 16d, 16e and 16f) in the package units (60a and 60b) may include the aforementioned light-emitting diodes. In some embodiments, the material of the light absorption layer 24 includes any suitable material that can absorb light with a specific wavelength. In some embodiments, the adhesive layer 26 may include any suitable adhesive material, and the array substrate 14 is attached to the circuit substrate 12 by the adhesive layer 26.

In the embodiment shown in FIG. 7, the size (for example, approximately between 100 μm and 500 μm) of the contact pads 32 between the package units (60a and 60b) and the array substrate 14 is large enough for performance testing. Therefore, in the embodiment shown in FIG. 7, the electronic device 10 does not require additional test pads, but the present disclosure is not limited thereto.

In some embodiments, a protective layer 58 is optionally disposed in the electronic device 10 to cover the light absorption layer 24, part of the package units (60a and 60b), and the electrical connection structure 20b. In some embodiments, the material of the protective layer 58 may include any suitable insulating material for planarization, protecting or isolating the underlying components, or for light absorption or light reflection.

Referring to FIGS. 8A-8D, in accordance with one embodiment of the present disclosure, a method for fabricating an electronic device is provided. FIGS. 8A-8D are schematic cross-sectional views of the method for fabricating an electronic device.

Figure 8A:
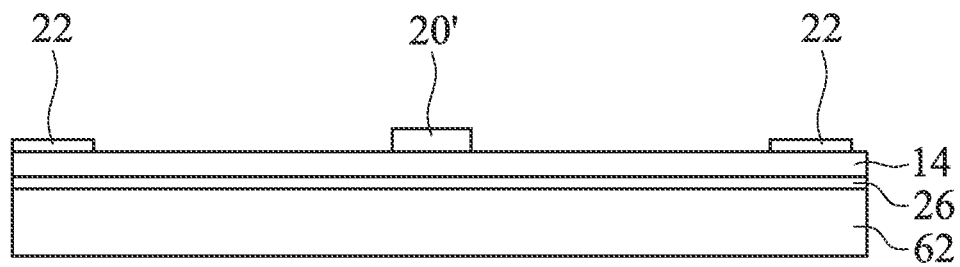
FIGS. 8A-8D are schematic cross-sectional views of a method for fabricating an electronic device in accordance with one embodiment of the present disclosure.

As shown in FIG. 8A, an array substrate 14 with a thin film transistor array, a metal pad 20' and test pads 22 disposed thereon is provided. The array substrate 14 is attached to a carrier 62 by an adhesive layer 26. It should be noted that the metal pad 20' can be a circular or annular pad, but it is not limited thereto. For the convenience of description, in FIGS. 8A to 8D, the second pad structure shown in FIGS. 2-7 will be omitted and will not be repeated.

Figure 8B:
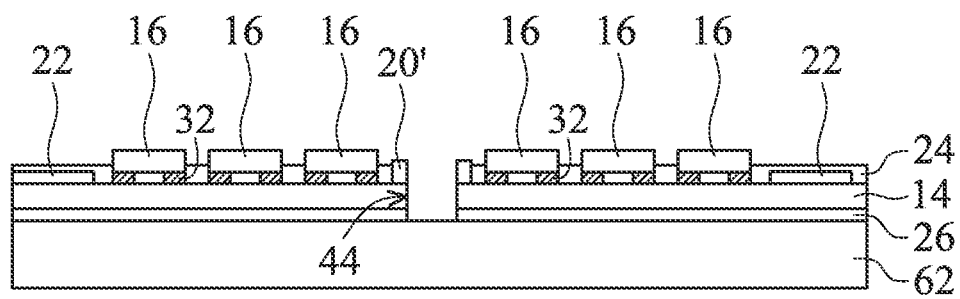

As shown in FIG. 8B, the performance of the thin film transistor array is tested by the test pads 22. After the test passes, a light absorption layer 24 covers the test pads 22. Light-emitting units 16 are bonded to the array substrate 14 by contact pads 32. The outer ring of the metal pad 20' is used as a mask. The material of the array substrate 14 in the inner ring is removed by methods such as laser, etching or drilling to form a through hole 44.

Figure 8C:
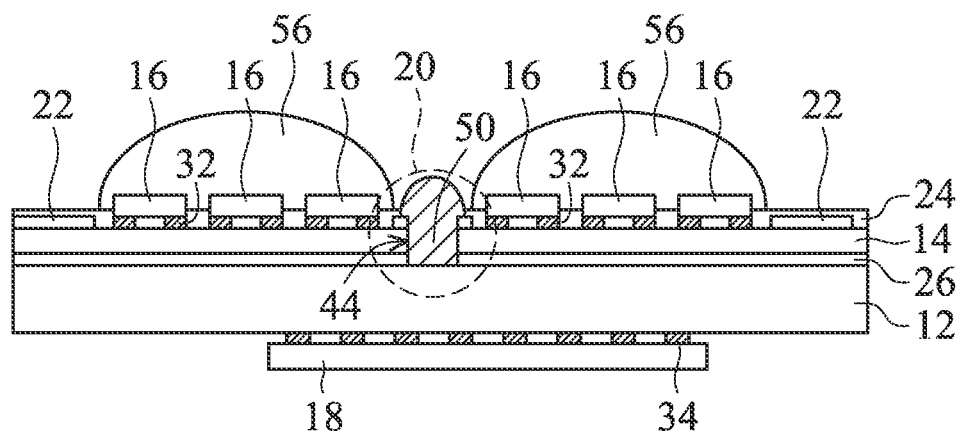

As shown in FIG. 8C, light extraction layers 56 cover the light-emitting units 16. The array substrate 14 is transferred from the carrier 62 to a circuit substrate 12. A conductive material 50 is filled into the through hole 44 to electrically connect the circuit substrate 12. The manufacture of the electrical connection structure 20 is completed. A driver 18 is bonded to the bottom of the circuit substrate 12 by contact pads 34.

Figure 8D:
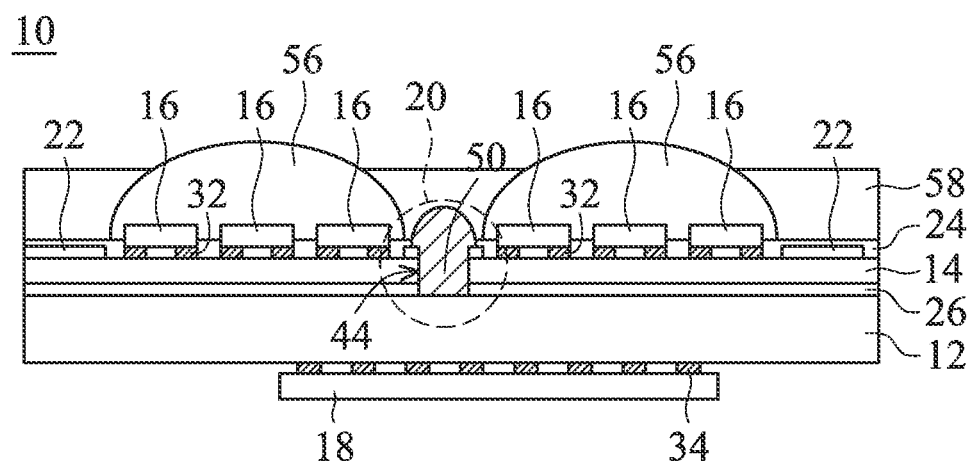

As shown in FIG. 8D, a protective layer 58 is disposed on the surface of the array substrate 14 to isolate the electrical connection structure 20. At this point, the manufacture of the electronic device 10 of the embodiment shown in FIGS. 8A to 8D is completed.

Referring to FIGS. 9A-9D, in accordance with one embodiment of the present disclosure, a method for fabricating an electronic device is provided. FIGS. 9A-9D are schematic cross-sectional views of the method for fabricating an electronic device.

Figure 9A:
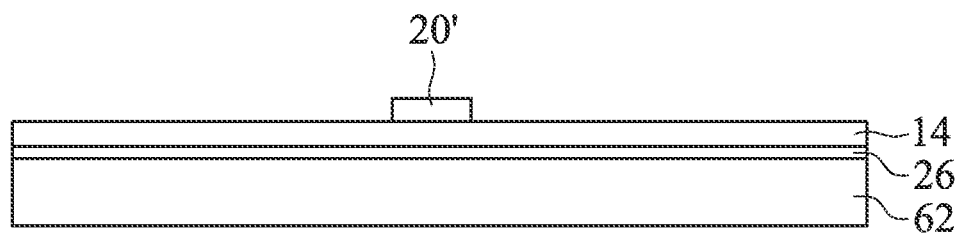
FIGS. 9A-9D are schematic cross-sectional views of a method for fabricating an electronic device in accordance with one embodiment of the present disclosure.

As shown in FIG. 9A, an array substrate 14 with a thin film transistor array and a metal pad 20' disposed thereon is provided. The array substrate 14 is attached to a carrier 62 by an adhesive layer 26.

Figure 9B:
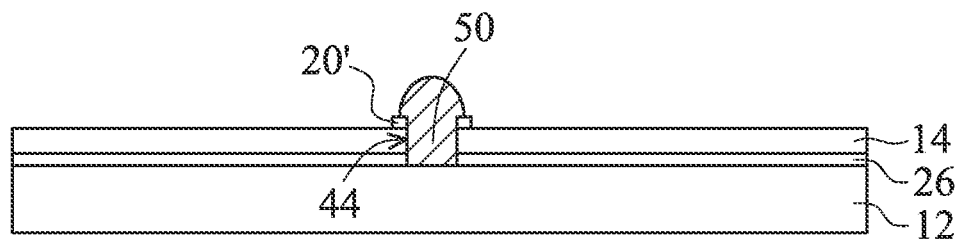

As shown in FIG. 9B, the outer ring of the metal pad 20' is used as a mask. The material of the array substrate 14 in the inner ring is removed by methods such as laser, etching or drilling to form a through hole 44. The array substrate 14 is transferred from the carrier 62 to a circuit substrate 12. A conductive material 50 is filled into the through hole 44 to electrically connect the circuit substrate 12. The manufacture of the electrical connection structure 20 is completed.

Figure 9C:
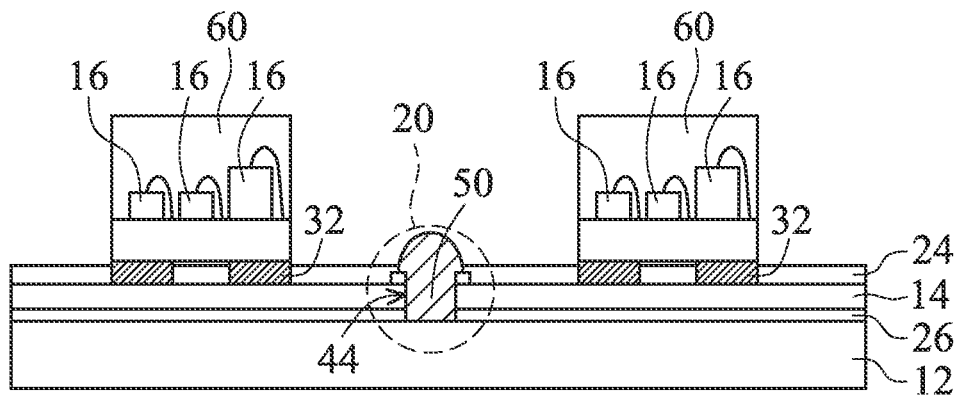

As shown in FIG. 9C, a light absorption layer 24 is disposed on the array substrate 14. Package units 60 are bonded to the array substrate 14 by contact pads 32. Each package unit 60 includes a plurality of light-emitting units 16.

Figure 9D:
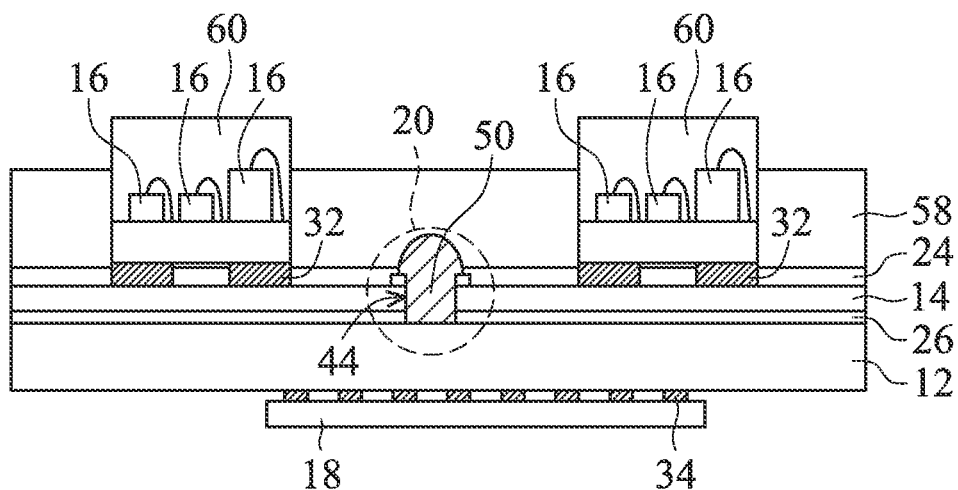

As shown in FIG. 9D, a driver 18 is bonded to the bottom of the circuit substrate 12 by contact pads 34. A protective layer 58 is disposed on the surface of the array substrate 14 to isolate the electrical connection structure 20. At this point, the manufacture of the electronic device 10 of the embodiment shown in FIGS. 9A to 9D is completed.

Figure 10:
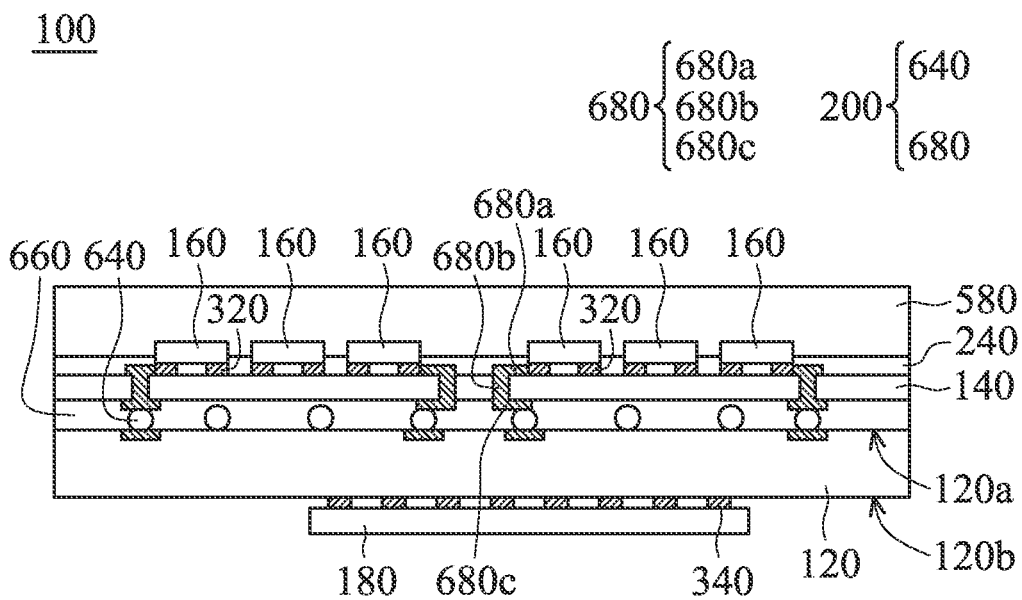
FIG. 10 is a schematic cross-sectional view of an electronic device in accordance with one embodiment of the present disclosure.

Referring to FIG. 10, in accordance with one embodiment of the present disclosure, an electronic device 100 is provided. FIG. 10 is a schematic cross-sectional view of the electronic device 100.

In the embodiment shown in FIG. 10, the electronic device 100 includes a circuit substrate 120, an array substrate 140, a plurality of light-emitting units 160, a driver 180, a plurality of electrical connection structures 200, a light absorption layer 240, an adhesive layer 660 and a protective layer 580. The circuit substrate 120 has a top surface 120a and a bottom surface 120b. A top circuit is disposed on the top surface 120a. A bottom circuit is disposed on the bottom surface 120b and electrically connected to the top circuit. A thin film transistor array is disposed on the array substrate 140. The array substrate 140 is disposed on the top surface 120a of the circuit substrate 120 and electrically connected to the top circuit. The light-emitting units 160 are disposed on the array substrate 140 through contact pads 320. The driver 180 is disposed on the bottom surface 120b of the circuit substrate 120 through contact pads 340 and electrically connected to the bottom circuit. The electrical connection structures 200 are disposed on the array substrate 140 and penetrate the array substrate 140 and the adhesive layer 660 to electrically connect the circuit substrate 120 and the driver 180 underneath the circuit substrate 120. The electrical connection structures 200 are located around the light-emitting units 160. The structural composition of the electrical connection structure 200 will be detailed later. The light absorption layer 240 covers the array substrate 140. The adhesive layer 660 is disposed between the circuit substrate 120 and the array substrate 140. The protective layer 580 covers the light absorption layer 240 and the light-emitting units 160.

The electronic device 100 shown in FIG. 10 is a light-emitting device, for example, a light-emitting diode (LED), but it is not limited thereto. The light-emitting diode may include, for example, an organic light-emitting diode (OLED), an inorganic light-emitting diode, a sub-millimeter light-emitting diode (mini LED), a micro light-emitting diode (micro LED) or a quantum dot light-emitting diode (QLED/QDLED), etc., but the present disclosure is not limited thereto. In the embodiment shown in FIG. 10, the circuit substrate 120, the array substrate 140, the light-emitting units 160, and the light absorption layer 240 are similar to the circuit substrate 12, the array substrate 14, the light-emitting units (16a-16f) and the light absorption layer 24 in the embodiment shown in FIG. 7, so they will not be repeated here. In the embodiment shown in FIG. 10, the adhesive layer 660 and conductive particles 640 can form a conductive adhesive such as an anisotropic conductive film (ACF) for bonding the array substrate 140 to the circuit substrate 120. In some embodiments, the conductive particles 640 may include conductive metals (such as nickel, gold, copper, silver, etc.) covered with polymer materials, or metal or metal alloy (such as tin alloy) particles, or a mixture of the above materials. In some embodiments, the conductive metal may include conductive metal alloy materials such as tin-silver-copper alloy, tin-indium alloy, tin-bismuth alloy, tin-gold alloy, or other tin alloys, but it is not limited thereto. In some embodiments, the material of the protective layer 580 may include any suitable insulating material for planarization, protecting or isolating the underlying components, or for light absorption or light reflection.

As shown in FIG. 10, the structural composition of the electrical connection structure 200 is described in detail below. The electrical connection structure 200 includes a connection pad 680 and conductive particles 640. The connection pad 680 includes a first part 680a, a second part 680b and a third part 680c. The first part 680a is formed on the array substrate 140 and is electrically connected to the circuit (not shown) of the array substrate 140. The second part 680b is connected to the first part 680a and passes through the array substrate 140 and the adhesive layer 660. The third part 680c is connected to the second part 680b and is electrically connected to the top circuit of the circuit substrate 120 through the conductive particles 640. Therefore, the circuit of the array substrate 140 and the top circuit of the circuit substrate 120 are electrically connected to each other by the electrical connection structure 200. In some embodiments, the material of the connection pad 680 may include a suitable conductive metal material, such as copper, nickel, silver, or gold, but it is not limited thereto. The electrical connection structure 200 electrically connects the array substrate 140 and the circuit substrate 120, that is, the signals on the array substrate 140 is transmitted to the circuit substrate 120 through the electrical connection structure 200.

Figure 11:
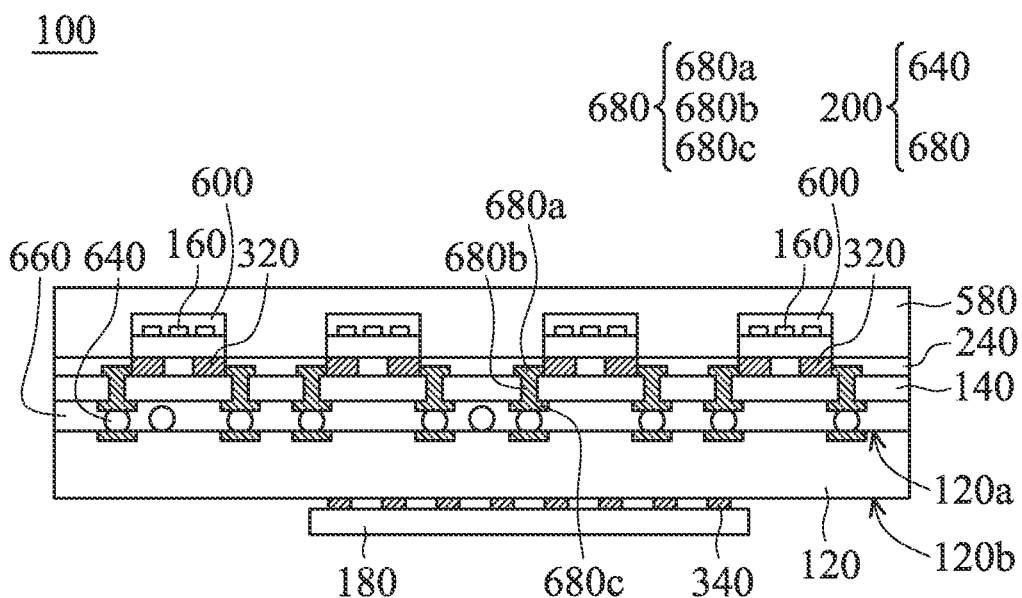
FIG. 11 is a schematic cross-sectional view of an electronic device in accordance with one embodiment of the present disclosure.

Referring to FIG. 11, in accordance with one embodiment of the present disclosure, an electronic device 100 is provided. FIG. 11 is a schematic cross-sectional view of the electronic device 100.

The electronic device 100 shown in FIG. 11 is a light-emitting device, for example, a light-emitting diode (LED), but it is not limited thereto. The light-emitting diode may include, for example, an organic light-emitting diode (OLED), an inorganic light-emitting diode, a sub-millimeter light-emitting diode (mini LED), a micro light-emitting diode (micro LED) or a quantum dot light-emitting diode (QLED/QDLED), etc., but the present disclosure is not limited thereto. The electronic device 100 includes a circuit substrate 120, an array substrate 140, a plurality of package units 600, a driver 180, a plurality of electrical connection structures 200, a light absorption layer 240 and an adhesive layer 660. The similarities with the embodiment shown in FIG. 10 will not be repeated. The main difference between the embodiment shown in FIG. 11 and the embodiment shown in FIG. 10 is that the package units 600 are electrically connected to the array substrate 140 through the contact pads 320 instead of the light-emitting units 160. More specifically, each of the package units 600 includes at least one light-emitting unit 160, and the package units 600 are disposed on the array substrate 140 through the contact pads 320.

In some embodiments, a protective layer 580 is optionally disposed in the electronic device 100 to cover the light absorption layer 240 and the package units 600. In some embodiments, the material of the protective layer 580 may include any suitable insulating material for planarization, protecting or isolating the underlying components, or for light absorption or light reflection. In addition, in FIG. 11, the protective layer 580 covers the package units 600, but the present disclosure is not limited thereto.

Figure 12:
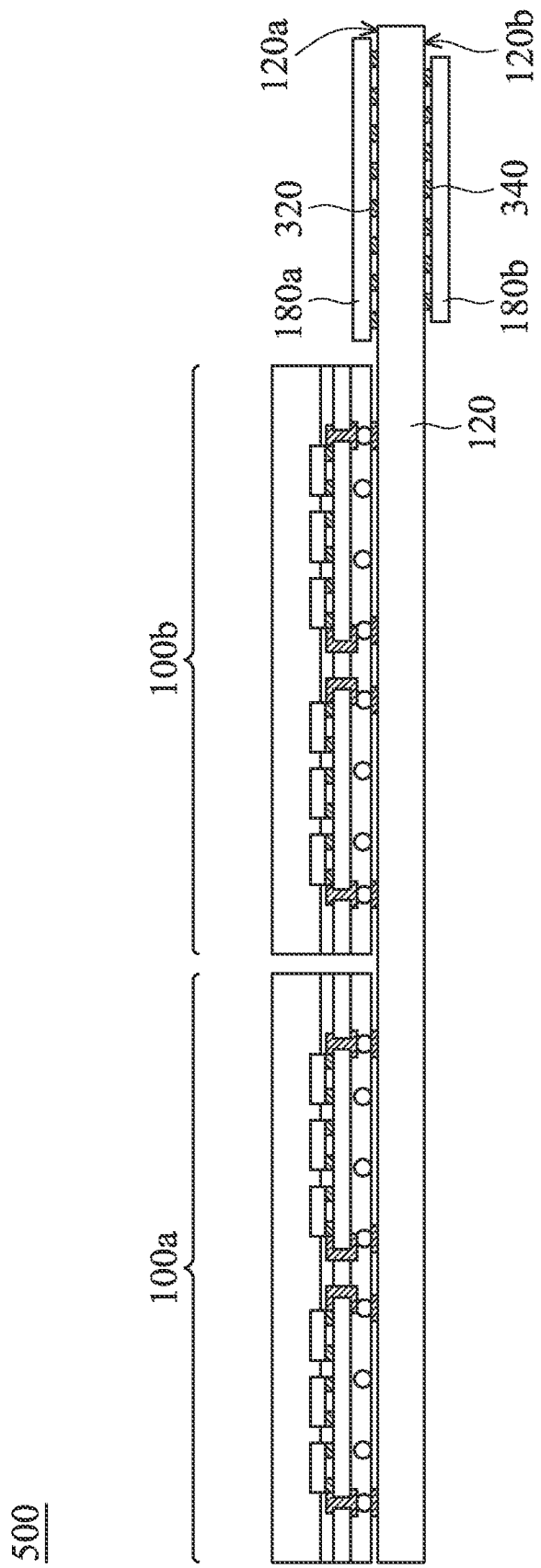
FIG. 12 is a schematic cross-sectional view of a tiled display in accordance with one embodiment of the present disclosure.

Referring to FIG. 12, in accordance with one embodiment of the present disclosure, an electronic device 500 is provided. FIG. 12 is a schematic cross-sectional view of the electronic device 500.

In the embodiment shown in FIG. 12, the electronic device 500 includes a circuit substrate 120, a plurality of light-emitting devices (100a and 100b) and a plurality of drivers (180a and 180b). The circuit substrate 120 has a top surface 120a and a bottom surface 120b. A top circuit is disposed on the top surface 120a. A bottom circuit is disposed on the bottom surface 120b and electrically connected to the top circuit. The light-emitting devices (100a and 100b) are sequentially tiled and arranged on the circuit substrate 120. The structural composition of the light-emitting devices (100a and 100b) is shown in FIG. 10 (not repeated here). The driver 180a is disposed on the top surface 120a of the circuit substrate 120 through the contact pads 320, and is electrically connected to the top circuit. The driver 180b is disposed on the bottom surface 120b of the circuit substrate 120 through the contact pads 340, and is electrically connected to the bottom circuit. In terms of component operation, the drivers (180a and 180b) can control the light-emitting devices (100a and 100b) respectively.

The electronic device 500 shown in FIG. 12 is a tiled display. For example, the tiled display includes the same or different light-emitting diodes as mentioned above, but it is not limited thereto. The light-emitting diode may include, for example, an organic light-emitting diode (OLED), an inorganic light-emitting diode, a sub-millimeter light-emitting diode (mini LED), a micro light-emitting diode (micro LED) or a quantum dot light-emitting diode (QLED/QDLED), etc., but the present disclosure is not limited thereto. In some embodiments, the circuit substrate 120 may include a printed circuit board (PCB), for example, a printed circuit board (PCB) with double-sided circuits, but it is not limited thereto.

Referring to FIGS. 13A-13D, in accordance with one embodiment of the present disclosure, a method for fabricating an electronic device is provided. FIGS. 13A-13D are schematic cross-sectional views of the method for fabricating an electronic device.

Figure 13A:
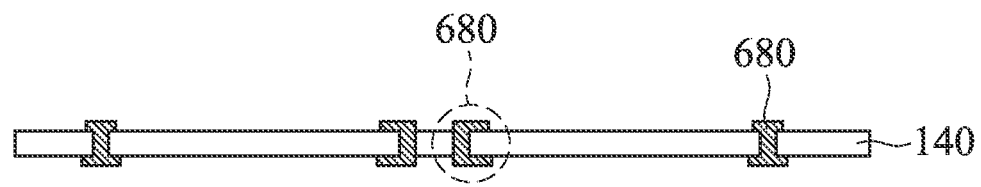
FIGS. 13A-13D are schematic cross-sectional views of a method for fabricating an electronic device in accordance with one embodiment of the present disclosure.

As shown in FIG. 13A, an array substrate 140 with a thin film transistor array and a plurality of connection pads 680 disposed thereon is provided.

Figure 13B:
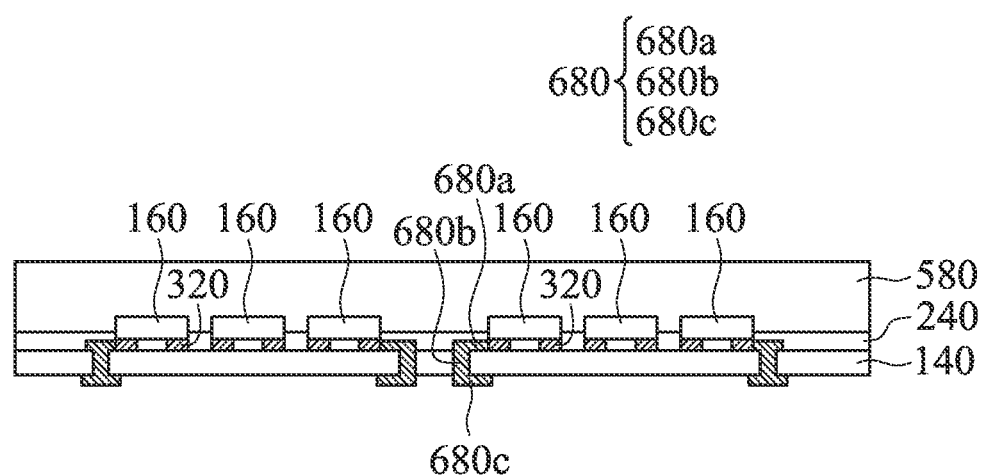

As shown in FIG. 13B, a light absorption layer 240 is disposed on the array substrate 140. Light-emitting units 160 are bonded to the array substrate 140 by contact pads 320. The protective layer 580 is disposed on the surface of the light absorption layer 240 and the light-emitting units 160. In some embodiments, a plurality of package units including the light-emitting units 160 (for example, the package units 600 in FIG. 11) can also be optionally bonded to the array substrate 140 through the contact pads 320.

Figure 13C:
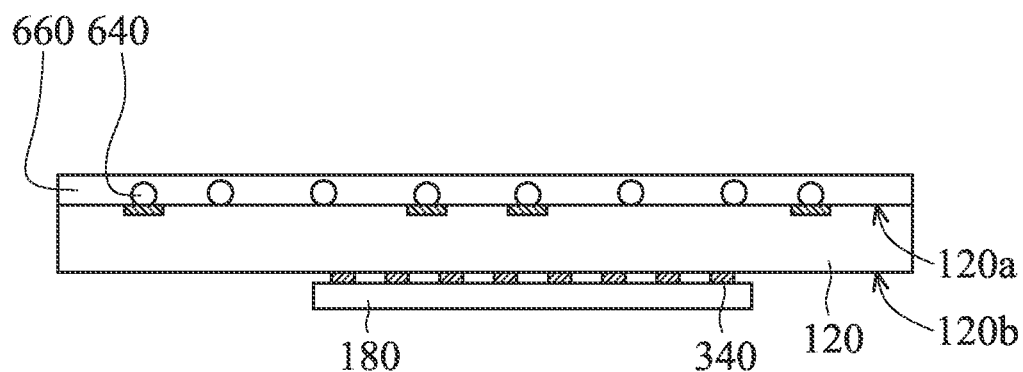

As shown in FIG. 13C, an adhesive layer 660 is attached to a circuit substrate 120. In some embodiments, the adhesive layer 660 includes an anisotropic conductive film (ACF) composed of conductive particles 640 and an insulating adhesive. A driver 180 is bonded to the bottom of the circuit substrate 120 by contact pads 340.

Figure 13D:
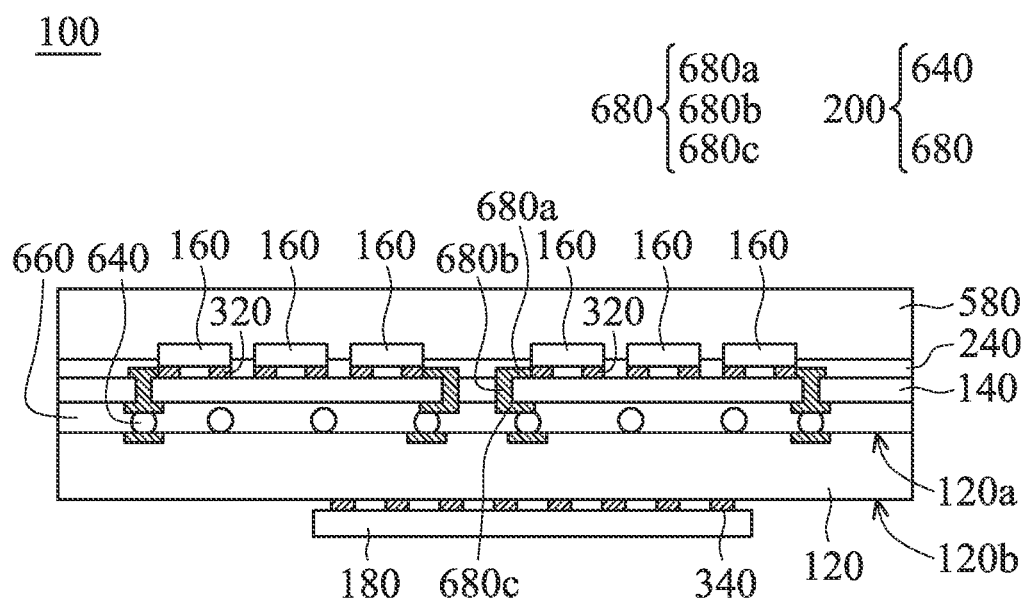

As shown in FIG. 13D, the array substrate 140 is attached to the circuit substrate 120 by the adhesive layer 660. At this point, the manufacture of the electronic device 100 of the embodiment shown in FIGS. 13A to 13D is completed.

Although some embodiments of the present disclosure and their advantages have been described in detail, it should be understood that various changes, substitutions and alterations can be made herein without departing from the spirit and scope of the disclosure as defined by the appended claims. The features of the various embodiments can be used in any combination as long as they do not depart from the spirit and scope of the present disclosure. Moreover, the scope of the present application is not intended to be limited to the particular embodiments of the process, machine, manufacture, composition of matter, means, methods and steps described in the specification. As one of ordinary skill in the art will readily appreciate from the present disclosure, processes, machines, manufacture, compositions of matter, means, methods, or steps, presently existing or later to be developed, that perform substantially the same function or achieve substantially the same result as the corresponding embodiments described herein may be utilized according to the present disclosure. Accordingly, the appended claims are intended to include within their scope such processes, machines, manufacture, compositions of matter, means, methods or steps. In addition, each claim constitutes an individual embodiment, and the claimed scope of the present disclosure includes the combinations of the claims and embodiments. The scope of protection of present disclosure is subject to the definition of the scope of the appended claims. Any embodiment or claim of the present disclosure does not need to meet all the purposes, advantages, and features disclosed in the present disclosure.

What is claimed is:

1. An electrical connection structure configured to electrically connect an array substrate and a circuit substrate, comprising:
    a through hole at least partially formed in the array substrate having a first end and a second end;
    a first pad at least partially surrounding the first end of the through hole and electrically connected to a first circuit;
    a second pad located at the second end of the through hole and electrically connected to a second circuit; and
    a conductive bridge electrically connecting the first pad and the second pad through the through hole, thereby making the first circuit and the second circuit electrically connected to each other, wherein the through hole exposes a portion of a top surface of the circuit substrate, and the conductive bridge has a first portion disposed in the through hole and has a second portion covering a part of a top part of the first pad, and wherein the second portion has a width greater than a width of the through hole, and the width of the second portion is defined as a width at a position that the conductive bridge contacts the top part of the first pad.

2. The electrical connection structure as claimed in claim 1, wherein the first pad completely surrounds the first end of the through hole to form a closed ring.

3. The electrical connection structure as claimed in claim 1, wherein the first pad partially surrounds the first end of the through hole to form an unclosed structure.

4. The electrical connection structure as claimed in claim 1, wherein the first pad and the second pad comprise copper, nickel or gold.

5. The electrical connection structure as claimed in claim 1, wherein the electrical connection structure electrically connects a first electronic component and a second electronic component.

6. The electrical connection structure as claimed in claim 5, wherein the first electronic component comprises the array substrate carrying the first circuit, and the first pad is formed on the array substrate.

7. The electrical connection structure as claimed in claim 6, wherein the second electronic component comprises the circuit substrate carrying the second circuit, and the second pad is formed on the circuit substrate.

8. The electrical connection structure as claimed in claim 5, further comprising an adhesive layer disposed between the first electronic component and a second electronic component.

9. The electrical connection structure as claimed in claim 8, wherein the through hole penetrates the adhesive layer.

10. The electrical connection structure as claimed in claim 1, wherein the conductive bridge comprises gold, copper or solder paste.

11. An electronic device, comprising:
    an electrical connection structure configured to electrically connect an array substrate and a circuit substrate, comprising:
        a through hole at least partially formed in the array substrate having a first end and a second end;
        a first pad at least partially surrounding the first end of the through hole and electrically connected to a first circuit;
        a second pad located at the second end of the through hole and electrically connected to a second circuit; and
        a conductive bridge electrically connecting the first pad and the second pad through the through hole, thereby making the first circuit and the second circuit electrically connected to each other, wherein the through hole exposes a portion of a top surface of the circuit substrate, and the conductive bridge has a first portion disposed in the through hole and has a second portion covering a part of a top part of the first pad, and wherein the second portion has a width greater than a width of the through hole, and the width of the second portion is defined as a width at a position that the conductive bridge contacts the top part of the first pad.

12. The electronic device as claimed in claim 11, wherein the second pad is formed on the circuit substrate.

13. The electronic device as claimed in claim 12, further comprising at least one light-emitting unit, wherein the at least one light-emitting unit is electrically connected to the circuit substrate through the electrical connection structure.

14. The electronic device as claimed in claim 13, wherein the at least one light-emitting unit comprises an organic light-emitting diode (OLED).

15. The electronic device as claimed in claim 13, wherein the at least one light-emitting unit comprises a light-emitting diode (LED).

* * * * *